(12) United States Patent
Michimata et al.

(10) Patent No.: US 7,414,291 B2
(45) Date of Patent: Aug. 19, 2008

(54) SEMICONDUCTOR DEVICE AND METHOD OF MANUFACTURING THE SAME

(75) Inventors: Shigetomi Michimata, Tokyo (JP); Ryo Nagai, Tokyo (JP); Satoru Yamada, Tokyo (JP); Yoshitaka Nakamura, Tokyo (JP); Ryoichi Nakamura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/099,511

(22) Filed: Apr. 6, 2005

(65) Prior Publication Data

US 2005/0230712 A1    Oct. 20, 2005

(30) Foreign Application Priority Data

Apr. 6, 2004    (JP)    ............. 2004-111926

(51) Int. Cl.
*H01L 29/72* (2006.01)
(52) U.S. Cl. .............. 257/368; 257/618; 257/757; 257/768; 257/773
(58) Field of Classification Search ........ 257/757, 257/768, 773, 368, 618, 764
See application file for complete search history.

(56) References Cited

U.S. PATENT DOCUMENTS

| | | | | |
|---|---|---|---|---|
| 6,963,097 B2* | 11/2005 | Kweon | ............... | 257/295 |
| 2003/0207569 A1* | 11/2003 | Gerritsen et al. | ........... | 438/683 |
| 2004/0079997 A1* | 4/2004 | Miura | .............. | 257/347 |
| 2005/0280118 A1* | 12/2005 | Lin et al. | ............. | 257/618 |

FOREIGN PATENT DOCUMENTS

| | | | |
|---|---|---|---|
| JP | 1-233726 | | 9/1989 |
| JP | 01-233726 | * | 9/1989 |
| JP | 10-242077 | | 9/1998 |
| JP | 11-145078 | | 5/1999 |
| JP | 11-297637 | | 10/1999 |
| JP | 2001-65303 | | 7/2001 |
| JP | 2003-52236 | | 6/2003 |

* cited by examiner

Primary Examiner—Edward Wojciechowicz
(74) Attorney, Agent, or Firm—Young & Thompson

(57) ABSTRACT

A method includes the steps of: implanting boron into a surface region of a silicon substrate to form a $p^+$ diffused region; implanting indium into the surface of the $p^+$ diffused region, to form an indium-implanted layer; forming a contact metal layer on the indium-implanted layer; and reacting silicon in the silicon substrate including the indium-implanted layer with metal in the contact metal layer to form a titanium silicide layer.

4 Claims, 13 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method for manufacturing the semiconductor device. More particularly, the present invention relates to a semiconductor device that is suitable as a device including contact plugs having a barrier metal layer made of high-melting-point metal, and also to a method for manufacturing the semiconductor device.

2. Description of the Related Art

In most semiconductor devices, the interconnection layers lying above the silicon substrate are connected to the silicon substrate, by using contact plugs including a barrier metal layer. A conventional method for manufacturing a semiconductor device will be described, with reference to FIGS. 5A to 5E.

First, as shown in FIG. 5A, boron is implanted into a specified surface region of a silicon substrate 11, at a dosage of $3 \times 10^{15}/cm^2$, thereby forming a p-type, heavily-doped diffused region ($p^+$ diffused region) 14. Then, as depicted in FIG. 5B, an insulating film 15 made of silicon oxide ($SiO_2$) is formed on the silicon substrate 11 that includes the $p^+$ diffused region 14. Subsequently, a contact hole 17 is formed, which penetrates the insulating film 15 to reach the $p^+$ diffused region 14.

Next, as illustrated in FIG. 5C, boron is implanted into a surface region of the $p^+$ diffused region 14 at a dosage of $3 \times 10^{15}/cm^2$ and an acceleration energy of 5 keV. A p-type-impurity dosed layer 27 is thereby formed in the vicinity of the bottom of the contact hole 17.

Further, as shown in FIG. 5D, a contact metal layer 18 is formed in the contact hole 17 and on the insulating film 15. The contact metal layer 18 is made of titanium and has a thickness of about 10 nm. The resultant structure is subjected to a heat treatment for about one minute, in a nitrogen gas ambient, while maintaining the substrate 11 at about 700° C. As a result, a titanium silicide layer (not shown) is formed at the interface between the silicon substrate 11 and the contact metal layer 18.

Then, as depicted in FIG. 5E, a barrier metal layer 19 is formed, which is made of titanium nitride (TiN) and which has a thickness of about 10 nm. A tungsten film 20 is then formed on the barrier layer 19 including the internal of the contact hole 17. Subsequently, a CPM process is performed, by removing a part of the tungsten layer 20, a part of the barrier metal layer 19 and a part of the contact metal layer 18 from top of the insulating film 15, thereby leaving a contact plug 21 within the contact hole 17. Further, an upper interconnection layer 16 is formed on the insulating film 15 and on the contact plug 21 by using a method known in the art. A semiconductor device 200 having the structure shown in FIG. 5F is thus manufactured.

In the method described above, boron is used as a dopant to form the p-type-impurity dosed layer 27 in the $p^+$ diffused region 14. The p-type-impurity dosed layer 27 is formed in order to prevent boron from diffusing from the $p^+$ diffused region 14 into the contact metal layer 18 when the substrate 11 undergoes a heat treatment performed at about 700° C. If boron diffuses into the contact metal layer 18 during the heat treatment, the concentration of boron in the $p^+$ diffused region 14 will decrease, inevitably increasing the contact resistance between the $p^+$ diffused region 14 and the contact plug 21.

The p-type-impurity dosed layer 27 can inhibit an increase in the contact resistance between the $p^+$ diffused region 14 and the contact plug 21.

In recent years, semiconductor devices have become smaller and smaller and more highly integrated. Thus, the contact holes in the semiconductor devices have become smaller in diameter. Here arises a problem in that if the diameter of contact holes decreases to about 0.2 µm, the contact resistance can hardly be reduced. To reduce the contact resistance, p-type impurities may be implanted at such a high dosage as $1 \times 10^{16}/cm^2$, after the contact holes have been made, to thereby form a p-type-impurity region having a high impurity concentration. However, the resistance has not been decreased to a desired value in the conventional technique. A method for forming p-type-impurity regions having a high impurity concentration is described in, for example, Jpn. Pat. Appln. Laid-Open Publication No. 1-233726.

SUMMARY OF THE INVENTION

In view of the foregoing problem in the conventional technique, it is an object of the present invention to provide a semiconductor device in which high-quality titanium silicide layers are provided even in contact holes of a small diameter, to thereby reduce the contact resistance. It is another object of the present invention to provide a method for manufacturing such a semiconductor device.

The present invention provides a method for manufacturing a semiconductor device including the steps of implanting boron into a surface region of a silicon substrate to form therein a diffused region, implanting indium in a surface region of the diffused region to form therein an indium-implanted region, forming a high-melting-point metal, layer on the indium-implanted region, and reacting high-melting-point metal in the high-melting-point metal layer with silicon in the silicon substrate including the indium-implanted layer to form a silicide layer.

The present invention also provides a semiconductor device including: a silicon substrate; a diffused region formed in a surface region of the silicon substrate; an indium-implanted region formed in a surface region of the diffused region; and a contact plug including at a bottom thereof a high-melting-point metal layer contacting the indium-implanted layer, wherein a compound crystal including high-melting-point metal in the high-melting-point metal layer and silicon protrudes from the contact plug.

In the method for manufacturing a semiconductor device according to the present invention, the indium-implanted layer formed on the diffused region before forming a high-melting-point metal layer allows a high-quality silicide layer including a silicide of a high-melting-point metal is formed even in contact holes having a small diameter. This can sufficiently decrease the contact resistance.

In a preferred embodiment of the present invention, the high-melting-point-metal silicide layer contains at least one element selected from the group consisting of Ti, W, Mo and Co, or at least one compound of these metal elements.

In a preferred embodiment of the present invention, the step of forming the silicide layer is a heat treatment for raising the substrate temperature up to 600° C. or above, preferably 700° C. or above. The high-melting-point metal may be titanium. In this case, a titanium silicide layer having a C49-crystal structure can be formed. The substrate temperature may be raised up to 800° C. or above. If this is the case, a titanium silicide layer having a C54-crystal structure can be formed.

In another preferred embodiment of the invention, indium is implanted at an acceleration energy that ranges form 40 to 120 keV. In another preferred embodiment of the present invention, indium is implanted at a dosage of $1\times10^{13}/cm^2$ to $1\times10^{15}/cm^2$.

In another preferred embodiment of the present invention, a heat treatment may be carried out between the step of forming an indium-implanted layer and the step of forming a high-melting-point metal layer. This heat treatment is to raise the substrate temperature up to 800° C. or above. The heat treatment enables the semiconductor device to have a more reliable silicide layer.

In the semiconductor device of the present invention and a semiconductor device manufactured by the method of the present invention, the compound crystal made of high-melting-point metal and silicon has a sufficiently lower resistivity. Moreover, it has a low contact resistance with respect to the silicon substrate and can provide a silicide layer having a large surface area. Hence, the compound crystal can serve to reduce contact resistance, even in contact holes having a small diameter. The high-melting-point metal layer may be a titanium layer. If so, the compound crystal has a C49-crystal structure or C54-crystal structure. The present invention can be suitably applied, particularly to a semiconductor device that includes a high-melting-point metal layer used as a barrier layer for the contact plug provided in a contact hole having a diameter of, for example, 0.2 μm or less.

DETAILED DESCRIPTION OF THE PREFERRED EMBODIMENTS

Figure 1:
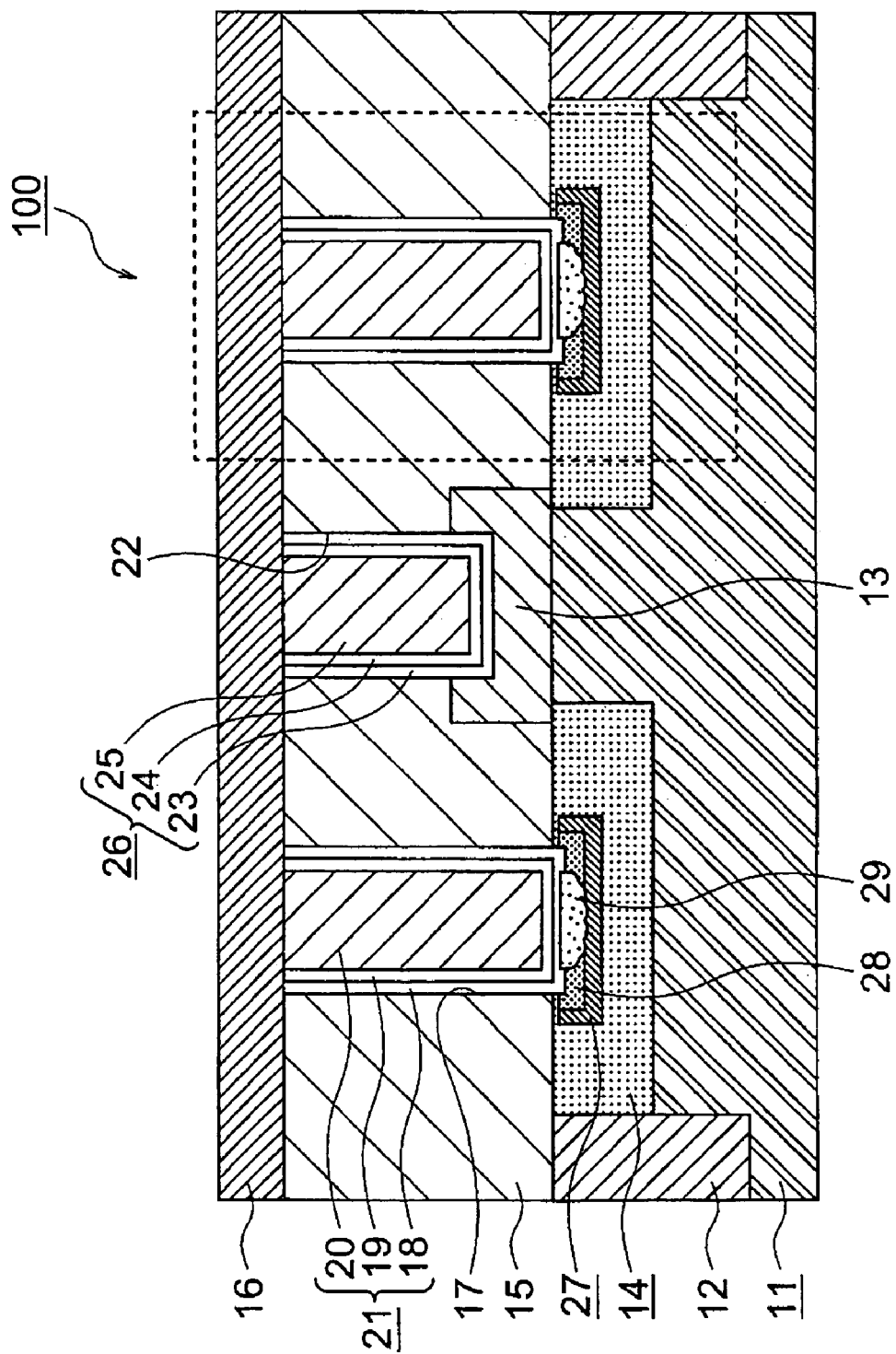
FIG. 1 is a sectional view representing the structure of a semiconductor device according to a first embodiment of the present invention.

Preferred embodiments of the present invention will be now described in detail, with reference to the accompanying drawings. FIG. 1 is a sectional view of a semiconductor device according to a first embodiment of the invention.

The semiconductor device, generally designated by numeral 100, of the first embodiment includes a silicon substrate 11 and a MOS transistor formed on the substrate 11. The substrate 11 has an element isolation region 12 and an active region. The element isolation region 12 is formed by an insulating film embedded in a trench to surround the active region, wherein the transistor is formed. A gate electrode 13 is provided on a gate insulating oxide film (not shown), which in turn is provided on the active region of the silicon substrate 11. In those parts of the active region, which lie on the sides of the gate electrode 13, there are two $p^+$ diffused regions 14 that are doped with boron implanted at a dosage of $1\times10^{15}/cm^2$. The $p^+$ diffused regions 14 configure a drain region and a source region of the MOS transistor. An insulating film 15 made of silicon oxide is formed on the silicon substrate 11 and the gate electrode 13. An upper interconnection layer 16 is formed on the insulating film 15. The insulating film 15 may be made of, for example, BPSG.

The insulating film 15 has therein contact holes 17 that extend to the top of the $p^+$ diffused regions 14. The contact holes 17 have a diameter of about 0.20 μm. Contact plugs 21 are formed in the contact holes 17. Note that the contact holes 17 extend into the silicon substrate 11, to a depth of about 25 nm measured from the top surface of the substrate 11. Each contact plug 21 includes a contact metal layer 18, a barrier metal layer 19, and a tungsten layer 20. The contact metal layer 18 is made of titanium, is about 10 nm thick and is formed on the bottom and inner wall of the contact hole 17. The barrier metal layer 19 is formed on the contact metal layer 18, made of titanium nitride and is about 10 nm thick. The tungsten layer 20 is formed on the barrier metal layer 19 and fills up the contact hole 17. If the contact meal layer 18 and the barrier metal layer 19 are formed by sputtering or the like, they will scarcely formed on the inner wall of the contact hole 17. During a heat treatment performed in the manufacture of the semiconductor device 100, a case may occur wherein the metal in the contact metal layer 18 changes to a silicide layer or diffuses into the underlying layer. Thus, the contact metal layer 18 should have a thickness of less than 10 nm or should not be formed at all.

The insulating film 15 has another contact hole 22, which extends to the top of the gate electrode 10A via-plug 26 is formed in this contact hole 22. The via-plug 26 includes a contact metal layer 23, a barrier metal layer 24, and a tungsten layer 25. The contact metal layer 23 is made of titanium and formed on the bottom and inner wall of the contact hole 22. The barrier metal layer 24 is made of titanium nitride and formed on the contact metal layer 23. The tungsten layer 25 is formed on the barrier metal layer 24 and fills up the contact hole 22.

A p-type-impurity dosed layer 27 is formed in that part of each $p^+$ diffused region 14, which lies at the bottom of the contact hole 17. The p-type-impurity dosed layer 27 has been formed by implanting boron at a dosage of $3\times10^{15}/cm^2$. An indium-implanted layer 28 has been formed by implanting indium at a-dosage of $5\times10^{13}/cm^2$. The boron concentration in the p-type-impurity dosed layer 27 is highest at a depth of about 110 nm measured from the bottom of the contact hole 17. The indium concentration in the indium-implanted layer 28 is highest at a depth of about 120 nm measured from the bottom of the contact hole 17. The boron-concentration profile and the indium-concentration profile result from a combination process including the implantation into the silicon substrate 11, the silicification of contact meal layer 18 and the re-distribution of impurities implemented by the heat treatment.

Beneath the contact meal layer 18, there is provided a bulbous or semi-spherical layer 29 of titanium silicide. The titanium silicide layer 29 protrudes from the contact metal layer 18 and as thick as, or thinner than, the indium-implanted layer 28. The titanium silicide layer 29 has a C49-crystal structure that has a resistivity of about 50 to 70 μΩcm.

The titanium silicide layer 29 has a sufficiently low resistivity and has a low contact resistance with respect to the silicon substrate. Further, the titanium silicide layer 29 has a large surface area, whereby the titanium silicide layer 29 can greatly reduce the contact resistance between the silicon substrate 11 and the contact plug 21.

A method for manufacturing the semiconductor device shown in FIG. 1 will be described. Particularly, the steps that are carried out, first to form the p+ diffused regions 14 and finally to form the contact plugs 21, will be detailed. FIGS. 2A to 2G are sectional views of that part of the semiconductor device 100, which is indicated within the broken-line frame in FIG. 1. These drawings depict the steps of manufacturing the semiconductor device 100.

Figure 2A:
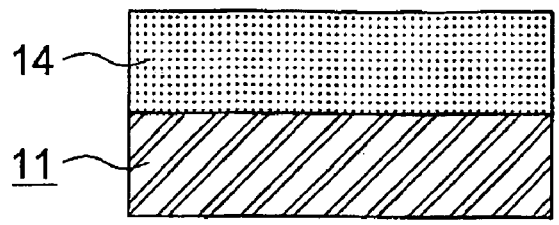
FIGS. 2A to 2G are sectional views depicting the steps of manufacturing the semiconductor device according to the first embodiment.

First, as depicted in FIG. 2A, boron is implanted into a specified surface region of a silicon substrate 11, at a dosage of $3 \times 10^{15}/cm^2$, thereby forming a p+ diffused region 14 in an active region. Then, an insulating film 15 made of silicon oxide and 0.8 μm thick is formed on the silicon substrate 11 that has the p+ diffused region 14. Subsequently, a contact hole 17 is made, which penetrates the insulating film 15 and has a diameter of about 0.20 μm.

Figure 2B:
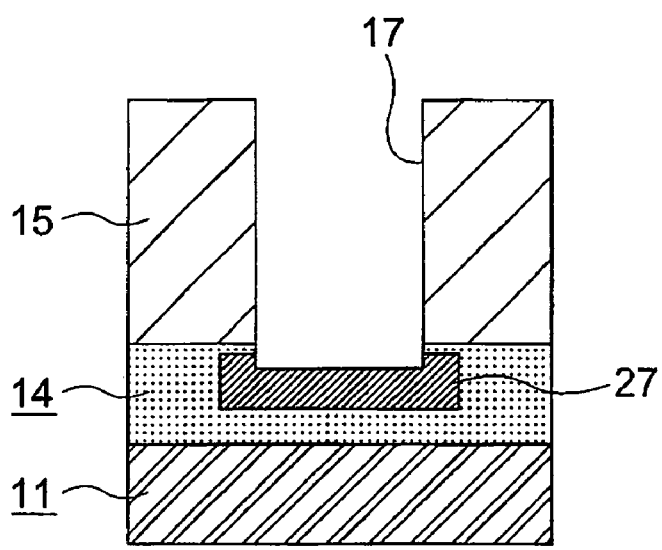

Next, as illustrated in FIG. 2B, boron is implanted into the p+ diffused region 14 at a dosage of $3 \times 10^{15}/cm^2$ and at an acceleration energy that allows the projection range $R_P$ to assume about 15 nm. A p-type-impurity dosed layer 27 is thereby formed in that part of p+ diffused region 14, which lies at the bottom of the contact hole 17. Further, as lo depicted in FIG. 2C, indium is implanted at a dosage of $5 \times 10^{13}/cm^2$ and at an acceleration energy of 60 keV. As a result, an indium-implanted layer 28 is formed in the p+ diffused region 14, at a projection range $R_P$ of about 15 nm measured from the bottom of the contact hole 17.

Figure 2C:
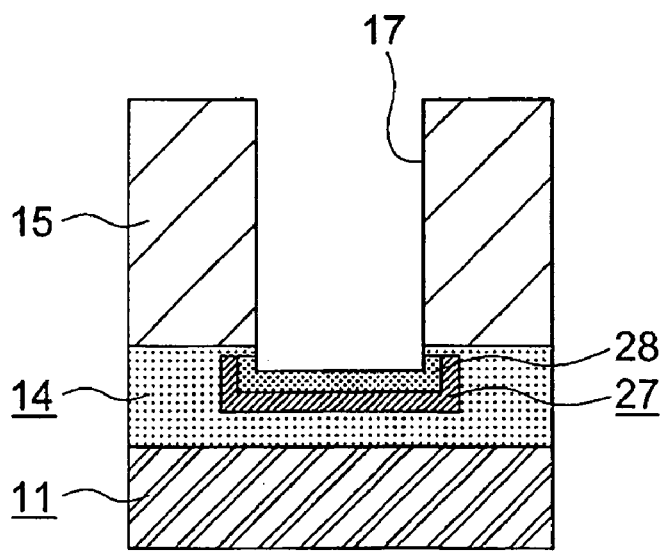
Figure 2D:
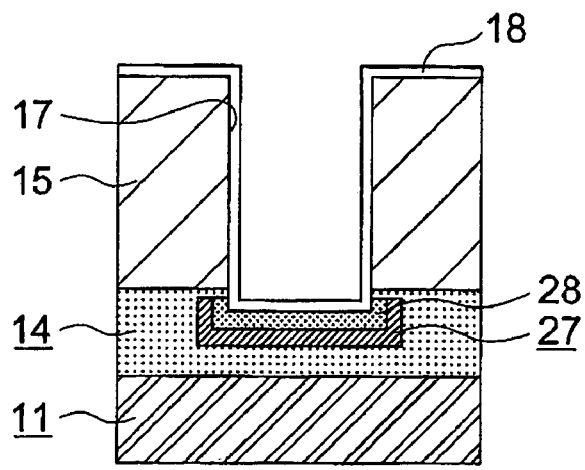
Figure 2E:
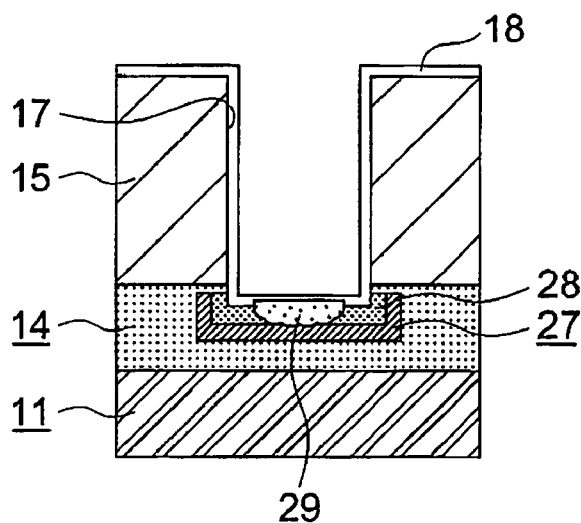

Thereafter, a CVD process is performed, thereby forming a contact metal layer 18 in the contact hole 17 and on the insulating film 15, as shown in FIG. 2D. The contact metal layer 18 is made of titanium and about 10 nm thick. The resultant structure is subjected to a heat treatment for about one minute, in a nitrogen gas ambient, while maintaining the substrate temperature at about 700° C. As a result, titanium in the contact metal layer 18 diffuses into the silicon substrate 11 through the interface between the silicon substrate 11 and the contact metal layer 18 and forms a silicide therein. Thus, a titanium silicide layer 29 protruding from the contact metal layer 18 is formed as illustrated in FIG. 2E. The contact metal layer 18 undergoes silicification at the interface between same and the silicon substrate 11, allowing the metal in the contact metal layer 18 to diffuse into the silicon substrate 11 or reacting with the insulating film 15. The contact metal layer 18 therefore becomes thinner. The contact metal layer 18 becomes thinner and thinner or disappear at all, as the contact metal layer 18 undergoes the subsequent heat treatment.

Figure 2F:
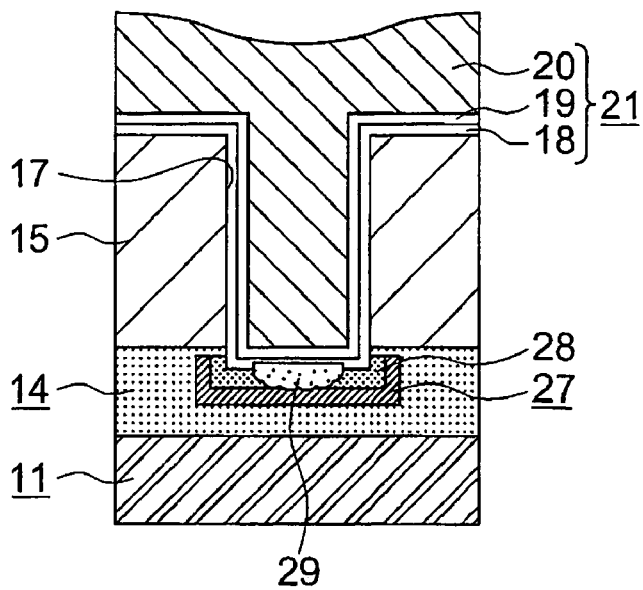
Figure 2G:
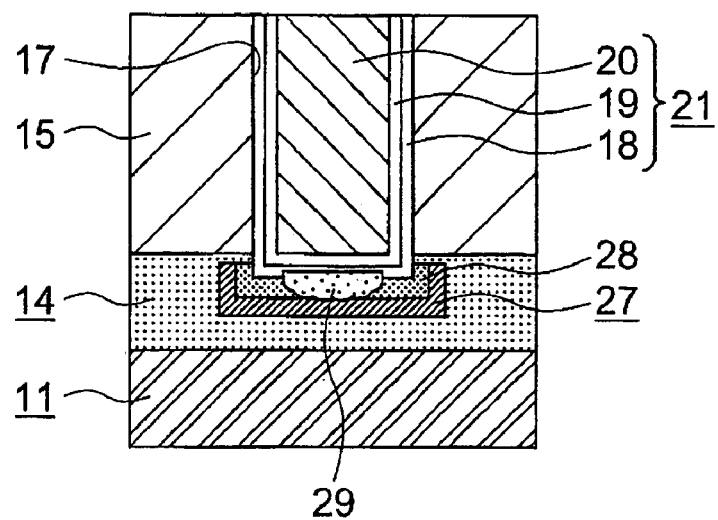

As illustrated in FIG. 2F, another CVD process is carried out, for forming a barrier metal layer 19 made of titanium nitride and having a thickness of about 10 nm. Then, a tungsten film 20 is formed on the barrier metal layer 19, filling the contact hole 17. A CMP process is then performed, for removing a part of the tungsten layer 20, a part of the barrier metal layer 19 and a part of the contact metal layer 18 each from the insulating film 15 as illustrated in FIG. 2G, thereby forming a contact plug 21 within the contact hole 17. Further, an upper interconnection layer 16 is formed on the insulating film 15 by using a method known in the art. The semiconductor device 100 of the structure shown in FIG. 1 is thus manufactured.

In the method for manufacturing a semiconductor device, according to the present embodiment, the indium-implanted layer 28 is formed in that part of the silicon substrate 11, which lies near the bottom of the contact hole 17, before the contact layer 18 is formed. The titanium silicide layer 29 that has a C49-crystal structure can therefore be reliably formed. The titanium silicide layer 29 thus formed has a bulbous shape or a semi-spherical shape. It has not been clarified why the reliable titanium silicide layer 29 is obtained. Nonetheless, it is considered due to the phenomenon that the indium-implanted promotes the silicification of titanium.

In the method described above, the indium-implanted layer 28 is formed after the p-type-impurity dosed layer 27 has been formed. Instead, the p-type-impurity dosed layer 27 may be formed after the indium-implanted layer 28 has been formed. In this case, a similar advantage can be attained. The substrate temperature may be raised up to 800° C. or above during the heat treatment. Then, titanium silicide will be formed, which has a C54-crystal structure and exhibits a resistivity of about 15 to 20 μΩcm. If this the case, the contact resistance can be decreased even more, because titanium silicide of a C54-crystal structure has a lower resistivity than titanium silicide of a C49-crystal structure.

The contact meal layer 18 and the barrier metal layer 19 may be formed by sputtering or the like. If they are so formed, layers 18 and 19 will scarcely lie on the inner wall of the contact hole 17. Nevertheless, the same advantage as described above may be achieved since the contact metal layer 18 is formed on the bottom of the contact hole 17.

Figure 6:
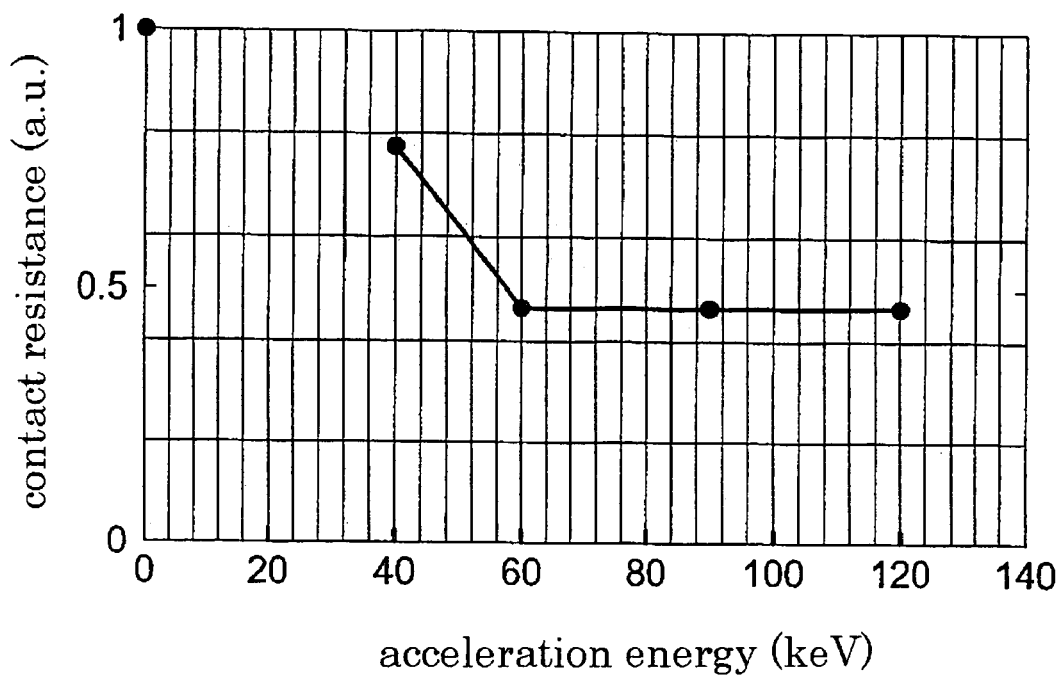
FIG. 6 is a graph representing the relation between contact resistance and acceleration energy.

The method for manufacturing the semiconductor device according to the first embodiment was employed, by implanting indium at a dosage of $8 \times 10^{13}/cm^2$ and at a variety of acceleration energies ranging from 40 to 120 keV, in order to form an indium-implanted layer 28. Semiconductor devices having a variety of characters were thereby manufactured. These devices were tested for the contact resistance between the silicon substrate and the contact plug. The results were such as shown in FIG. 6. Note that indium was not implanted when no acceleration energy was applied (i.e., energy=0).

As seen from FIG. 6, a higher acceleration energy for implanting indium reduces the contact resistance. Further, the reduction of the contact resistance is almost saturated when the acceleration energy ranges from 60 keV to 120 keV, as can be understood from FIG. 6. In view of this, the acceleration energy for implanting indium is set to 40 keV or above, preferably 60 keV or above. If the acceleration energy is 40 keV, the projection range Rp of indium implanted into the silicon substrate will be about 15 nm. If the acceleration energy exceeds 120 keV, the projection range Rp of indium will be excessively long and indium will be implanted to an excessively deep region. Consequently, indium will not be implanted into a desired region.

Figure 7:
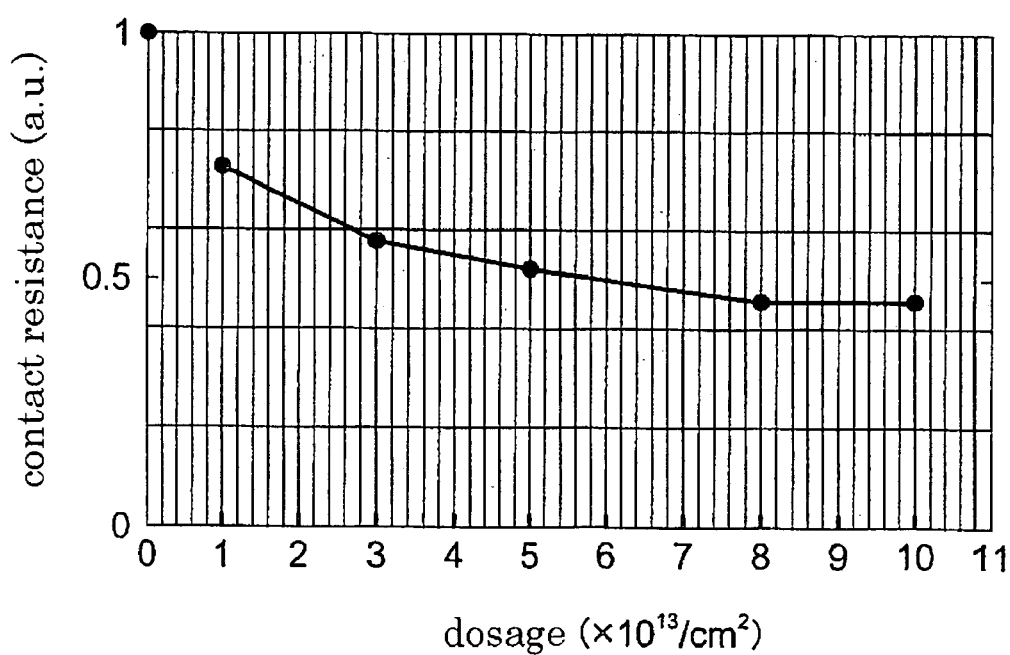
FIG. 7 is a graph representing the relation between contact resistance and impurity dosage.

The method for manufacturing the semiconductor device according to the first embodiment was employed for an experimental purpose. More precisely, indium was implanted at an acceleration energy of 60 keV, at a variety of dosages ranging from $1 \times 10^{13}/cm^2$ to $1 \times 10^{14}/cm^2$. Various semiconductor devices were thereby manufactured. These devices were tested for the contact resistance between the silicon substrate and the contact plug. The results were such as shown in FIG. 7. Note that indium was not implanted in the graph at the point of a dosage of "0".

As evident from FIG. 7, if the dosage at which indium implanted increases from $1\times10^{13}/cm^2$, the contact resistance decreases. As also understood from FIG. 7, the reduction of the contact resistance is almost saturated when the dosage is $8\times10^{13}/cm^2$ or above. In view of this, the dosage at which indium is implanted should be set to $1\times10^{13}/cm^2$ or above, preferably, $8\times10^{13}/cm^2$ or above.

Figure 8A:
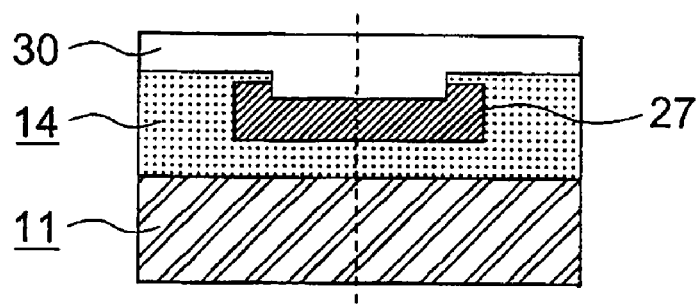
FIG. 8A is a sectional view of comparative example 1 prepared for measuring a concentration profile.
Figure 8B:
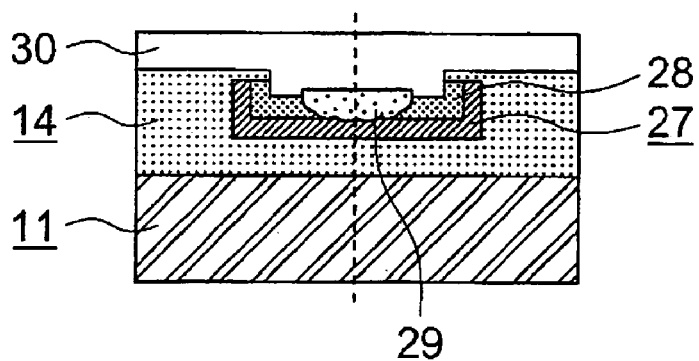
FIG. 8B is a sectional view of an example of a semiconductor device according to the present invention.

In the method for manufacturing the semiconductor device according to the first embodiment and the conventional method for manufacturing the device, a titanium nitride film, about 20 nm thick, was formed in place of the contact metal layer 18 and barrier metal layer 19. The resultant semiconductor device was analyzed for the concentration profiles of various elements. To measure the concentration profiles, the titanium nitride film and any layer provided above the titanium nitride film were removed, providing a comparative example-1 shown in FIG. 8A. Further, a silicon oxide ($SiO_2$) film. 28, about 50 nm thick, was formed on the resultant structure, thereby providing a sample of the present invention shown in FIG. 8B. In manufacturing the semiconductor device of the comparative example-1, boron was implanted to form a $p^+$ diffused region 14 and a p-type-impurity dosed layer 27 in the same condition as in the manufacture of the device of the sample of the present invention, and the contact hole 17 was made to have the same diameter as in the sample of the present invention.

Figure 9:
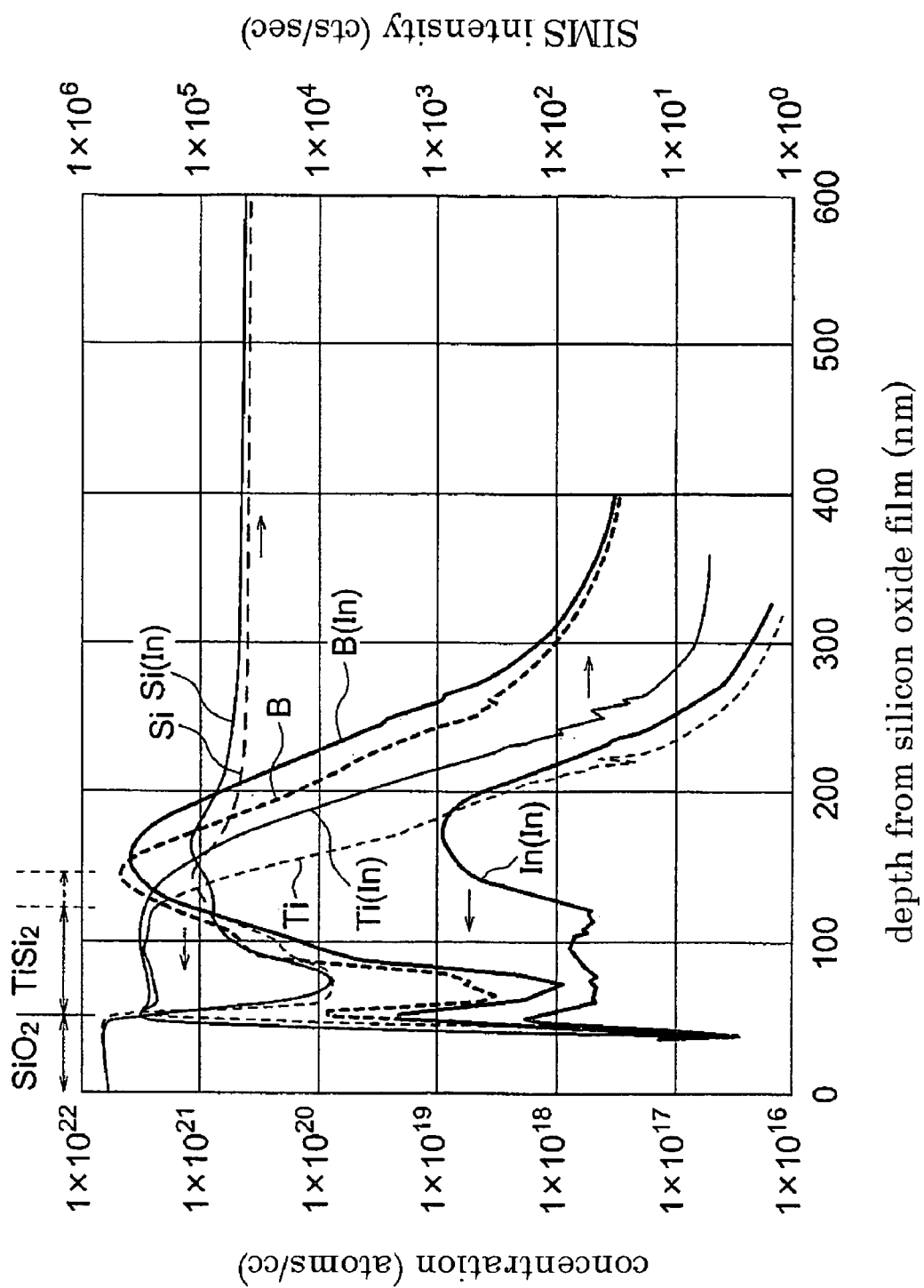
FIG. 9 is a graph illustrating the concentration profiles of elements that are used in semiconductor devices.

FIG. 9 represents the concentration profiles of various elements in the comparative example-1, and also the concentration profiles of various elements in the sample of the present invention. The graph of FIG. 9 shows the results of measuring the concentration profiles of silicon (Si), titanium (Ti), boron (B) and indium (In), by using a secondary ion mass spectrometer (SIMS). To be more specific, the concentration profiles were measured at a section of the comparative example-1, taken along the broken line in FIG. 8A, and a section of the sample of the present invention, taken along the broken line in FIG. 8B. In FIG. 9, curves Si, Ti and B indicate the concentration profiles pertaining to the semiconductor device of comparative example-1, and curves Si(In), Ti(In), B(In) and In(In) indicate the concentration profiles pertaining to the semiconductor device of the sample of the present invention. The concentration profiles are represented for silicon and titanium in terms of the intensity of secondary ions, plotted on the right y-axis, and for boron and indium in terms of the concentration of elements, plotted on the left y-axis.

In FIG. 9, the depth of 0 nm represents the surface of the silicon oxide layer 30 shown in FIGS. 11A and 11B. The depth of 50 nm represents the boundary between the silicon oxide layer 30 and the silicon substrate 11. The semiconductor device of the sample of the present invention was examined by the use of a transmission electron microscope. It was confirmed that the titanium silicide layer 29 was formed to the depth of about 120 nm to 140 nm. From FIG. 9, it can be understood that the titanium silicide layer 29 has an impurity concentration close to the peak of indium concentration. It is also understood that the peaks of titanium concentration and boron concentration in the sample of the present invention lie about 20 nm deeper than in the comparative example-1.

The method described above may be modified such that the substrate temperature is maintained at 950° C. for 10 seconds by means of RTA (rapid thermal annealing), after the indium-implanted layer 28 is formed as shown in FIG. 2C and before the contact metal layer 18 is formed as depicted in FIG. 2D. The modified method can form the titanium silicide layer 29 more reliably than the method for manufacturing the semiconductor device according to the first embodiment, thus providing a semiconductor device that has a contact resistance further reduced. The modified method was performed, holding the substrate at various temperatures of 1000° C. or less during the RTA heat treatment. It was confirmed that the contact resistance was lower than in the case where no RTA heat treatment was carried out, when the substrate was maintained at 800° C. or above during the RTA heat treatment. It was also found that the constant resistance much lower than in the case where no RTA heat treatment was performed, when the substrate temperature was maintained at 900° C. to 950° C.

The contact resistance is decreased if the RTA heat treatment is performed before the contact metal layer 18 is formed. This is probably because the indium implanted is activated to diffuse again during the RTA heat treatment, and the silicification of metal in the contact metal layer 18 results in a desirable condition.

Figure 10A:
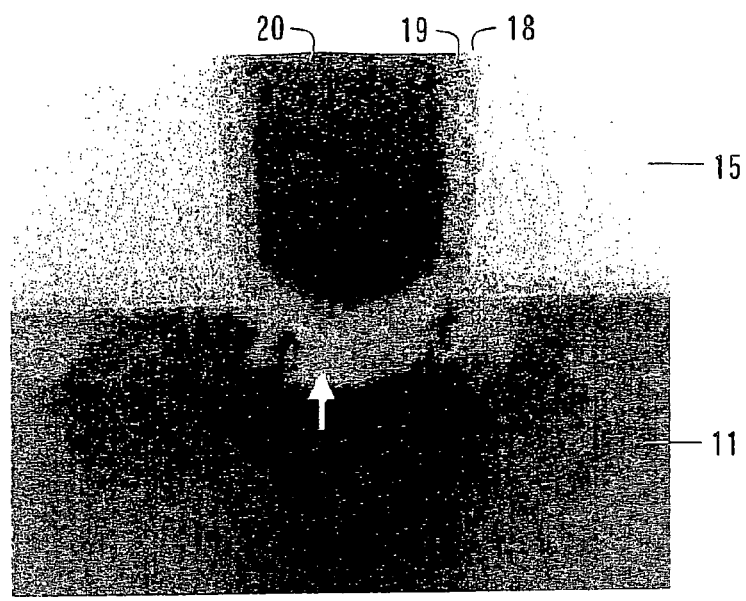
FIGS. 10A to 10C are sectional TEM photographs, each showing the interface between the silicon substrate and contact plug of a semiconductor device.
Figure 10B:
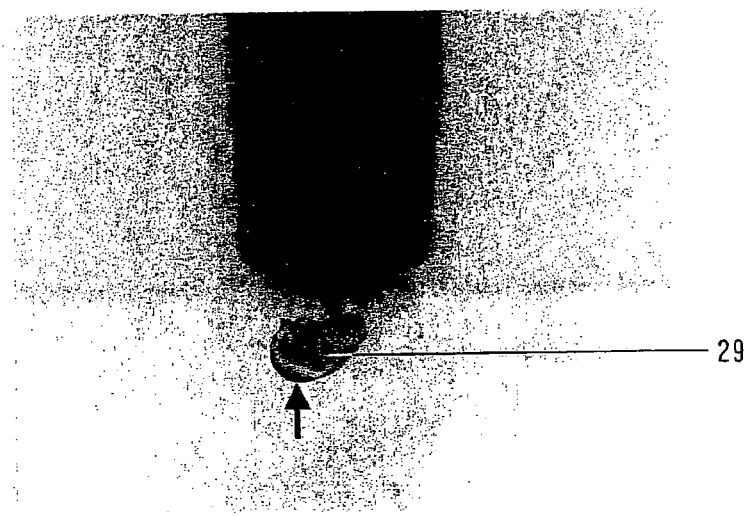
Figure 10C:
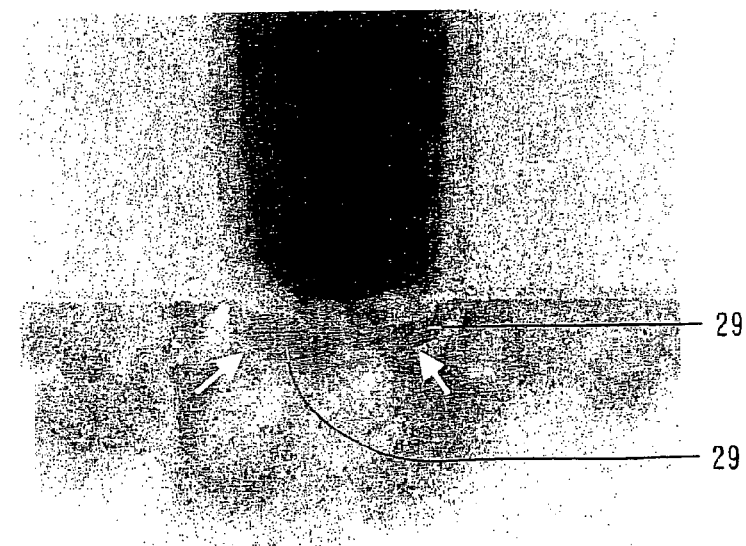

The method according to the first embodiment and the modified method were carried out, by manufacturing three semiconductor devices including a comparative example-2, a sample-1 and a sample-2. These devices were photographed by using a transmission electron microscope. (TEM). FIGS. 10A to 10C are sectional TEM photographs, each showing the interface between the silicon substrate 11 and the contact plug 21. In manufacturing the comparative example-2, boron was implanted to form a $p^+$ diffused region 14 and a p-type-impurity dosed layer 27 in the same condition as in the manufacture of the first and second examples. Moreover, the contact hole 17 and the insulating film 15 were made to have the same diameter and the same thickness, as in the manufacture of the first and second examples.

Electron diffraction test was carried out on the comparative example-2, at the position indicated by the arrow in FIG. 10A, and on the sample-1, at the position indicated by the arrow in FIG. 10B. Silicon crystals were observed in the semiconductor device of the comparative example-2. The two-dimensional distribution of Ti was evaluated by means of EDX (Energy-Dispersive X-ray) analysis. As a result, titanium was detected in a large region beneath the contact metal layer 18. This proves that titanium in the contact metal layer 18 did not form C49 crystals or C54 crystals, though it diffused into the silicon substrate 11.

On the other hand, titanium silicide of a C49-crystal structure was observed in the semiconductor device of the sample-1. This proves that a titanium silicide layer 29 of a C49-crystal structure, being almost bulbous and protruding from the contact metal layer 18, was provided in that part of the silicon substrate 11, which lie near the contact plug 21. Electron diffraction test was not performed on the semiconductor device of the sample-2. Nonetheless, it is believed that semi-spherical, titanium silicide layers 29 of a C49-crystal structure, which protrude from the contact metal layer 18, have been formed at the positions indicated by an arrow in FIG. 10C.

Figure 11:
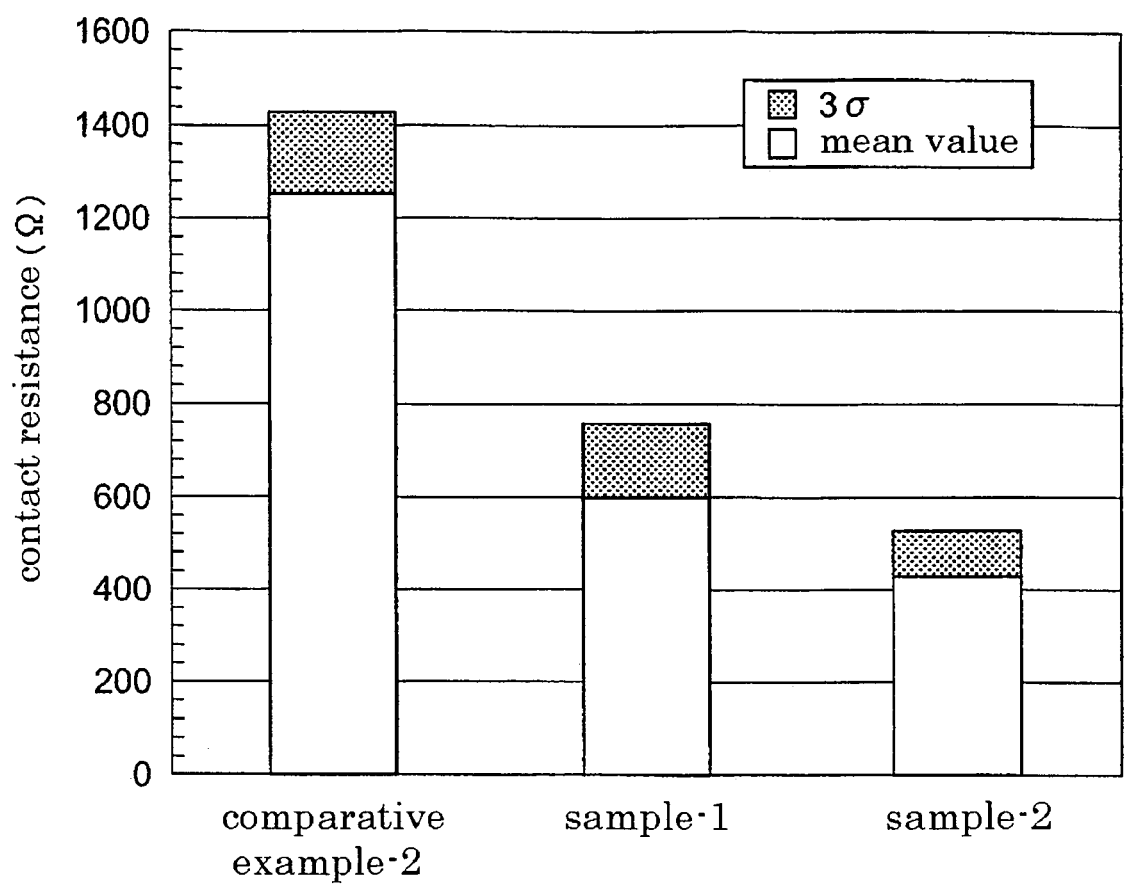
FIG. 11 is a graph showing the substrate-plug contact resistances that are observed in various semiconductor devices.

A plurality of devices for the comparative example-2, a plurality of devices for the sample-1, and a plurality of devices for the sample-2 were manufactured. These semiconductor devices were tested for the contact resistance. FIG. 11 shows the average contact resistance of the devices for each of the example and samples, and also the contact resistance of cumulative frequency 3 σ. As seen from FIG. 11, the devices for sample-1 had contact resistance that is half that of the devices for the comparative example-2, and the devices for the sample-2 had contact resistance that is a third of that of the devices for the comparative example-2.

Figure 3:
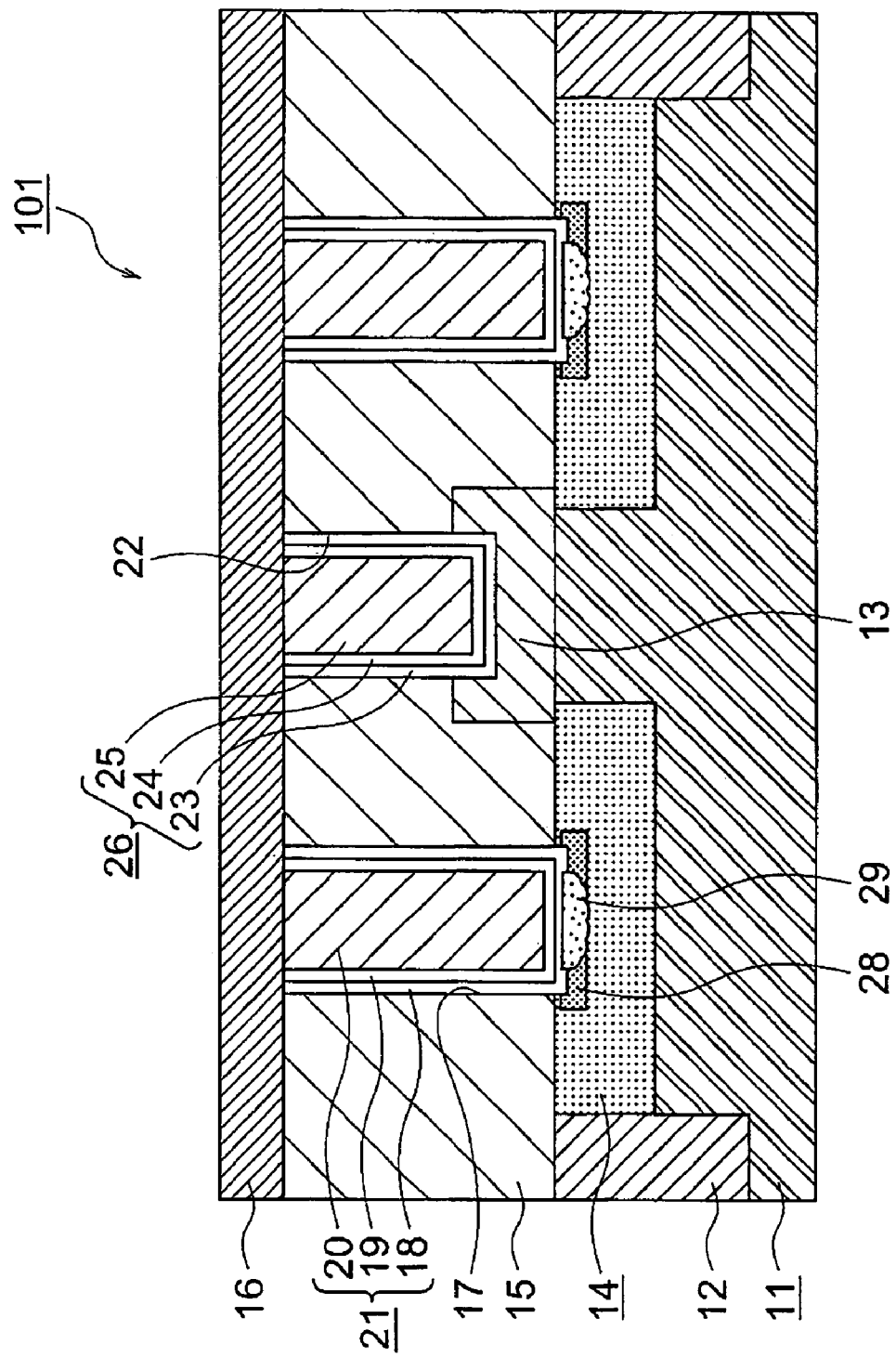
FIG. 3 is a sectional view illustrating the structure of a semiconductor device according to a second embodiment of the present invention.

FIG. 3 is a sectional view illustrating the structure of a semiconductor device 101 according to a second embodiment of the present invention. The semiconductor device 101 is identical in the structure to the semiconductor device 100 shown in FIG. 1, i.e., the first embodiment of the present invention, except that no p-type-impurity dosed layer 27 is provided. The method for manufacturing the device 101 is similar to the method for manufacturing the device 100, except that no p-type-impurity dosed layer 27 is formed. The device 101 according to the second embodiment has a significantly lower contact resistance as compared with the conventional semiconductor device, though the contact resistance of the second embodiment is somewhat higher than that of the device according to the first embodiment.

Figure 4A:
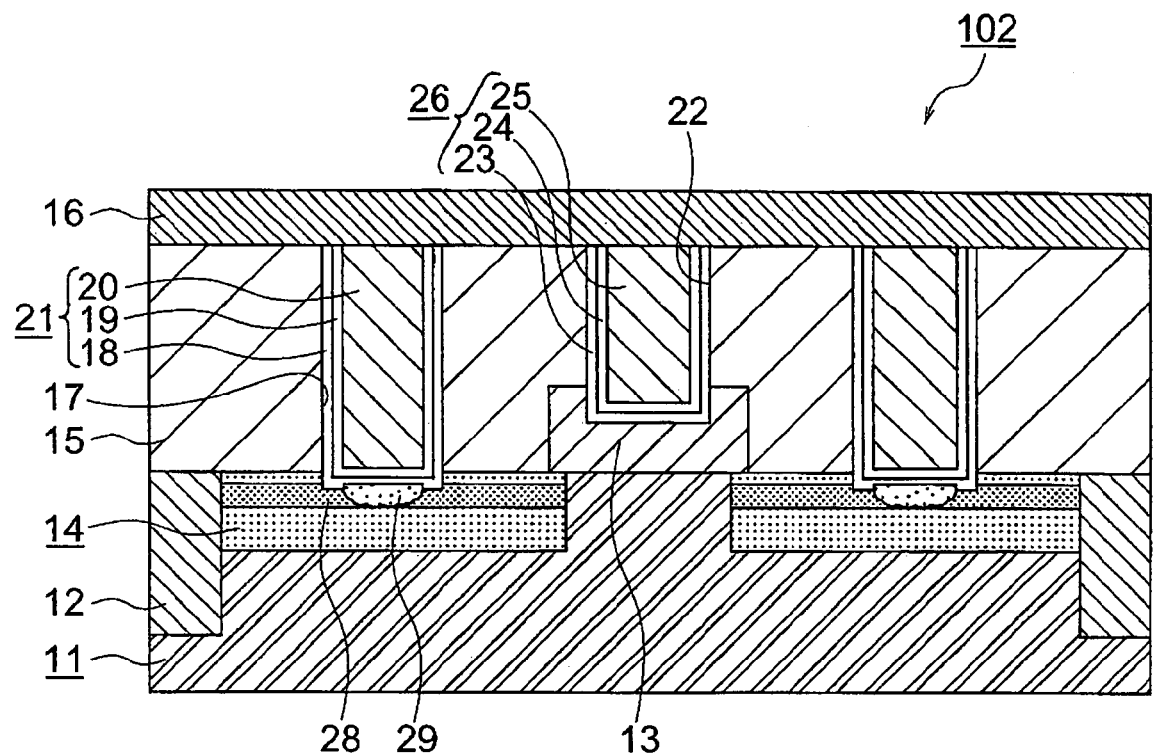
FIG. 4A is a sectional view illustrating the structure of a semiconductor device according to a third embodiment of the present invention.

FIG. 4A is a sectional view illustrating the structure of a semiconductor device 102 according to a third embodiment of the present invention. The semiconductor device 102 is identical in the structure to the semiconductor device 100 shown in FIG. 1, except for the following two points. First, it has no p-type-impurity dosed layer 27. Second, the indium-implanted layer 28 is formed on the entire surface of the p$^+$ diffused region 14.

Figure 4B:
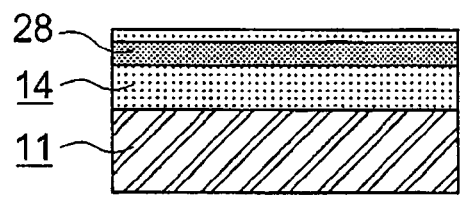
FIG. 4B is a sectional view depicting one of the steps of a method for manufacturing the semiconductor device according to the third embodiment.
Figure 5A:
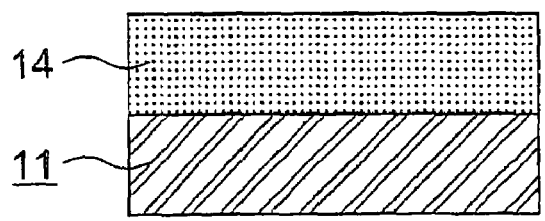
FIGS. 5A to 5F are sectional views showing consecutive steps of a conventional method for manufacturing a semiconductor device.
Figure 5B:
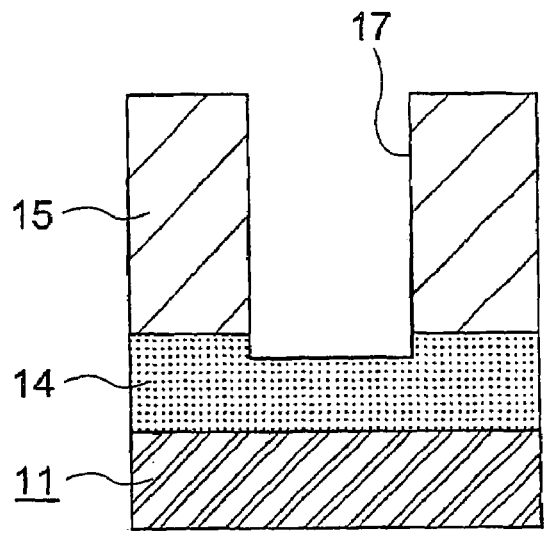
Figure 5C:
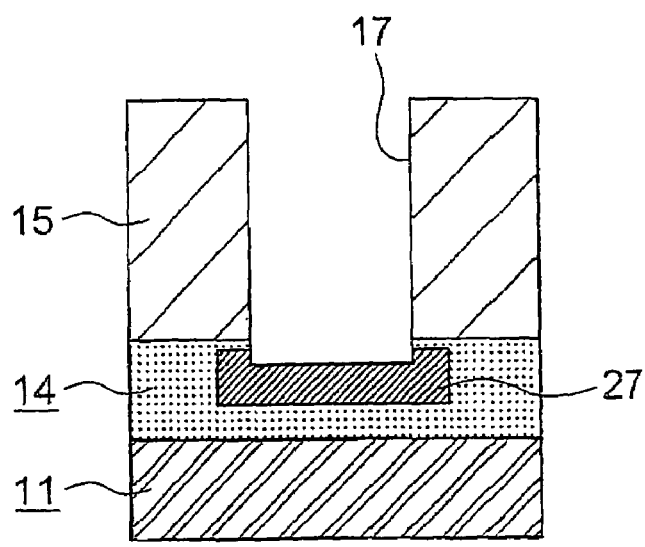
Figure 5D:
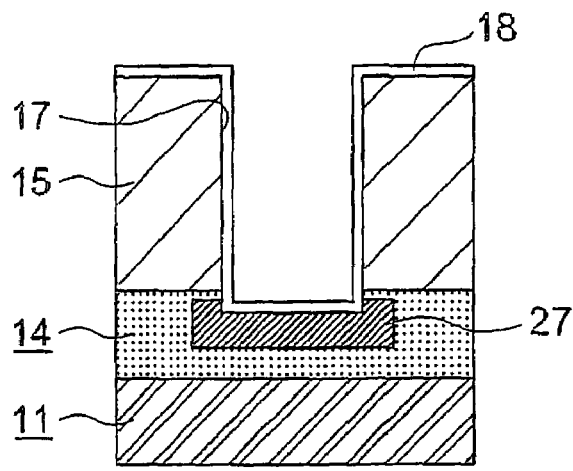
Figure 5E:
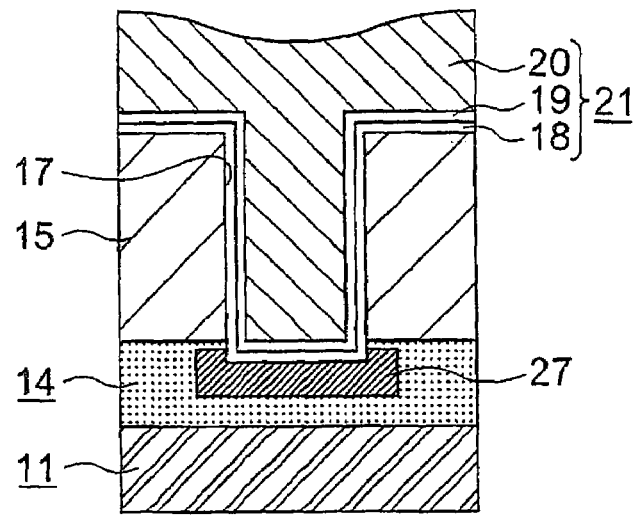
Figure 5F:
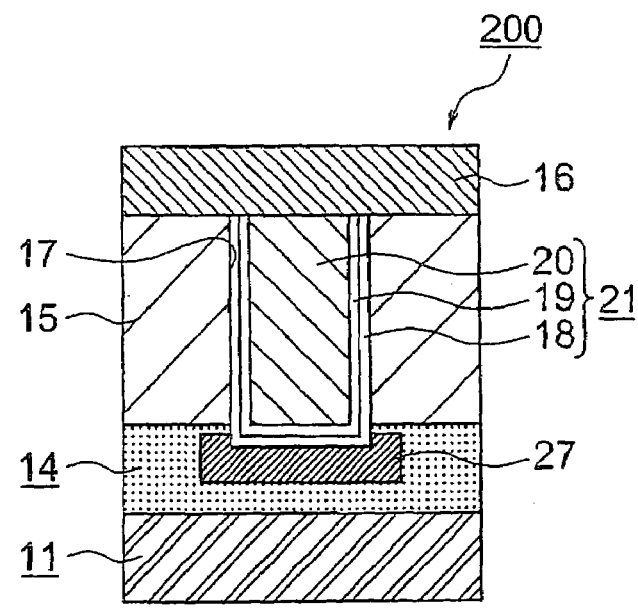

In the method for manufacturing the semiconductor device 102 according to the third embodiment, a p$^+$ diffused region 14 is formed as shown in FIG. 2A. Then, an indium-implanted layer 28 is formed on the entire p$^+$ diffused region 14 as illustrated in FIG. 4B, by implanting indium into the entire surface of the p$^+$ diffused region 14 at a dosage of $5\times10^{13}/cm^2$ and at such an acceleration energy that corresponds to a projection range Rp of about 15 nm.

The acceleration energy for implanting indium is rather high so that indium may be distributed in the same way as in the case where indium is implanted after the contact hole 17 is made. The method does not have the step of forming a p-type-impurity dosed layer 27 (see FIG. 2B) and the step of forming an indium-implanted layer 28 (see FIG. 2C). Except for these points, the method is similar to the method for manufacturing the semiconductor device according to the first embodiment.

The contact resistance of the semiconductor device manufactured by the method according to the third embodiment is much lower than that of the conventional semiconductor device, though the contact resistance of the third embodiment is somewhat higher than the contact resistance attained in the first embodiment. Like the modification of the first embodiment, the second embodiment and the third embodiment have lower contact resistances, because an RTA heat treatment is performed before the contact metal layer 18 is formed.

The preferred embodiments of the present invention have been described heretofore. Nevertheless, the present invention is not limited to the embodiments described above. Rather, the present invention includes various devices and various methods of manufacturing the devices, which may be obtained by changing or modifying the above-described embodiments.

The present invention can be suitably applied, particularly to semiconductor devices that have contact plugs, such as MOS transistors and bipolar transistors, and also to methods of manufacturing such semiconductor devices.

What is claimed is:

1. A semiconductor device comprising:
   a silicon substrate;
   a diffused region formed in a surface region of said silicon substrate;
   a contact plug and, at a bottom of said contact plug, a titanium layer contacting said diffused region; and
   an indium-implanted region formed in said diffused region only at the bottom of said contact plug;
   wherein said indium-implanted region is formed under said contact plug and a bulbous or semispherical titanium silicide layer protrudes from the bottom of said contact plug into said indium-implanted region in said diffused region.

2. The semiconductor device according to claim 1, wherein said titanium silicide layer has a thickness equal to or smaller than the thickness of the indium implanted layer.

3. The semiconductor device according to claim 1, wherein said diffused region is a boron diffused region.

4. The semiconductor device according to claim 1, wherein a length of said bulbous or semispherical titanium silicide layer measured from the bottom of said contact plug is greater than 50 nm.

* * * * *